United States Patent [19]
Afzali-Ardakani et al.

[11] Patent Number: 4,567,490
[45] Date of Patent: Jan. 28, 1986

[54] ELECTROEROSION RECORDING MEDIUM OF IMPROVED LUBRICITY

[75] Inventors: Ali Afzali-Ardakani, Katonah; Mitchell S. Cohen, Ossining; Keith S. Pennington, Somers; Krishna G. Sachdev, Wappingers Falls, all of N.Y.

[73] Assignee: International Business Machines Corporation, Armonk, N.Y.

[21] Appl. No.: 567,300

[22] Filed: Dec. 30, 1983

[51] Int. Cl.⁴ .................. G01D 15/34; B05D 5/12; B32B 5/16; G03C 5/24
[52] U.S. Cl. .................. 346/135.1; 427/121; 428/323; 428/327; 428/461; 428/469; 430/495; 430/524
[58] Field of Search ............... 346/135.1; 430/49, 524, 430/495; 427/121; 428/323, 327, 461, 469

[56] References Cited

U.S. PATENT DOCUMENTS

| | | | |
|---|---|---|---|
| 3,983,564 | 9/1976 | Nakazawa et al. | 346/1 |
| 4,371,879 | 2/1983 | Hohn et al. | 346/135.1 |
| 4,400,706 | 8/1983 | Takemura et al. | 346/135.1 |
| 4,423,132 | 12/1983 | Kondo et al. | 430/67 |

OTHER PUBLICATIONS

Radiation Chem., Photochem. Publ., vol. 85, 1976, Item 85:85533d, Pressure Sensitive Copying.
Ozark-Mahoning Bulletin, Fluorographite TM Polymers.

Primary Examiner—Joseph W. Hartary
Assistant Examiner—Gerald E. Preston
Attorney, Agent, or Firm—George E. Clark; Jackson E. Stanland

[57] ABSTRACT

Electroerosion recording materials are provided with a surface lubricant film of particulate lubricating nonconductive graphite fluoride and optional conductive materials in a polymeric binder. The lubricating agents reduce stylus scratching of the conductive layer during electroerosion printing, improve contrast, provide a beneficial coating on the writing electrode or stylus and improve the handling and writing characteristics of the recording material. The lubricating agents/polymer films are especially useful (1) where the substrate of the recording material is light transmissive and, after the electroerosion process, the resulting product is suitable for direct-negative applications and (2) where direct offset masters are produced by removal of noneroded lubricant film.

17 Claims, 3 Drawing Figures

ELECTROEROSION RECORDING MEDIUM OF IMPROVED LUBRICITY

BACKGROUND OF THE INVENTION

The invention relates to electroerosion printing and to recording materials exhibiting improved lubricity for use in such processes, and especially for use in either direct-negative applications or the production of direct offset masters.

Electroerosion printing is a well-known technique for producing markings, such as, letters, numbers, symbols, patterns such as circuit patterns, or other legible or coded indicia on recording material in response to an electric signal which removes or erodes material from the surface of the recording material as the result of spark initiation.

The surface which is eroded or removed to provide such indicia on the recording material is usually a thin film of conductive material which is vaporized in response to localized heating associated with sparking (arcing) initiated by applying an electric current to an electrode in contact with the surface of a recording material comprising the thin conductive film on a non-conductive backing or support. In the present state of the technology the thin conductive film is usually a thin film of vaporizable metal, such as aluminum.

Electroerosion printing is effected by the movement of a stylus or a plurality of styli relative to the surface of specially prepared recording media. Electrical writing signals are fed to the stylus to provide controlled electrical pulses which generate sparks at the surface of the recording material to selectively heat and remove by evaporation a layer of the recording materal. The locations from which material is removed correspond to the indicia or images which are to be recorded.

In the course of this process, the stylus is moved relative to a surface of the recording material and in contact with the removable layer, i.e., the thin film of vaporizable material.

In high speed and high resolution printing processes there may be thirty or more styli arranged to form a print head. As the styli are actuated by computer controlled voltage pulses, arcing and consequently high local temperatures cause evaporation of the conductive layer to record the desired information.

Due to the fragility of the thin conductive layer and limitations in the precise adjustment of styli pressure, in a multi-styli head considerable scratching (undesired removal of the removable layer) is observed to take place during high resolution electroerosion printing.

It has been recognized for some time, therefore, that the use of a lubricant and/or protective overcoat on the surface of such electroerosion recording material would be helpful to reduce scratching by the styli. Application of lubricants comprising long chain fatty acids such as stearic acid, palmitic acid etc., were found to reduce the scratching problem somewhat but considerable stylus scratching of the thin aluminum film of electroerosion recording materials continues to be observed. Therefore, efforts have been directed to finding a superior lubricant-protective layer composition for the surface of electroerosion recording materials.

In co-pending application Ser. No. 454,744 filed Dec. 30, 1982, and filed in the name of Mitchell S. Cohen, one of the coinventors herein, there are described graphite-cellulosic binder based overlayer compositions for electroerosion recording materials. Among the various laminar solids and other soft compounds and soft metal particles disclosed in Ser. No. 454,744 for use as the lubricant conductive particles graphite, due to its cost, effectiveness and easy dispersibility, is the preferred material described therein.

While the lubricant overlayer compositions described previously provide substantial improvement in print quality, it is desirable that still better systems be developed so as to eliminate the "baking" and "fouling" problem caused by accumulation of the eroded organic-/inorganic debris on the print-head.

It has been found desirable to reduce the conductivity of the graphite-binder overcoat in order to achieve better print definition. In addition, it has been desired to provide overcoats for electroerosion recording materials characterized by low surface energy, improved mechanical strength, and good lubricity, and improvements in terms of reduced stylus fouling and reduced head wear. Also and that debris generated during the printing process should not be adherent to the print-head.

One approach considered for lowering the conductivity of the graphite-polymeric binder protective overcoat was to increase the binder content of the protective layer. However, with this approach, there is a problem of stylus fouling caused by accumulation of organic polymeric/oligomeric debris generated during the electroerosion process.

Among prior disclosures relevant to electroerosion printing, U.S. Pat. No. 2,983,220, Dalton et al, discloses a lithographic coating on an electroerosion recording sheet; the coating may be a copolymer containing zinc oxide and zinc sulfide. An internal layer containing conductive material, such as, graphite is disclosed in U.S. Pat. No. 3,048,515, Dalton. An electroresponsive recording blank having a removable masking layer containing a luminescent material is described in U.S. Pat. No. 2,554,017, Dalton. Other prior art providing further general background in the field of electroerosion printing includes U.S. Pat. Nos. 3,138,547, Clark and 3,411,948, Reis. High temperature lubricants comprising graphite in oil are also known, as is described in U.S. Pat. No. 3,242,075, Hunter.

SUMMARY OF THE INVENTION

It has been found that improved electroerosion recording materials can be prepared by applying to the surface of such materials a lubricating protective layer containing graphite fluoride (fluorination product of graphite) as solid lubricants, or a mixture of graphite fluoride and graphite in an organic polymeric binder.

Conductive solid lubricants other than graphite may be selected from the various conductive particulate lubricants disclosed in Ser. No. 454,744, the entire disclosure of which is expressly incorporated herein by reference.

Graphite fluorides such as the Fluorographite TM products of Ozark-Mahoning, the preferred nonconductive solid lubricants, can be obtained in particulate size of the order of 0.05–5 $\mu m$, have the inertness of the partially fluorinated graphite and provide a low energy and hydrophobic surface.

The overlayer disclosed herein can be applied directly to the surface of electroerosion recording materials.

One object of the invention, therefore, is to produce electroerosion recording materials of improved resistance to stylus scratching by use of the special lubricating coatings of this invention.

Another object of the invention is to provide a superior lubricant composition which also exhibits improved contrast when used to produce direct-negatives by electroerosion printing. In such usage a dark graphite/organic polymer/graphite fluoride film serves to help block light that may be partially transmitted through the thin conductive film, e.g., a thin aluminum film.

Another object of this invention is to provide a recording material that causes little or no wear of the print-head during the electroerosion process.

The materials incorporated in the recording materials of this invention also have the advantage of coating the recording styli with a light, fluffy, easily removable layer because of their high lubricity. This layer inhibits the build-up of eroded organic/inorganic debris which could otherwise cause stylus "fouling" or "baking" onto the styli and result in the cessation of printing or deteriorated print quality.

Another advantage of the lubricating overlayer of this invention is that it is highly hydrophobic with low surface energy and the debris generated during printing does not adhere to the styli. Thus the overlayer protects the printhead, allowing hundreds of thousands of sweeps without affecting the print quality. When used in combination with graphite, the conductivity provided by the graphite appears to enhance the dielectric break-down through the overlayer.

Another object is to provide an improved short term offset master by electroerosion recording.

Further, the lubricants of this invention may be incorporated in a layer which provides both protection to the recording sheet during handling and lubrication during the electroerosion process.

DETAILED DESCRIPTION AND THE PREFERRED EMBODIMENT OF THE INVENTION

Figure 1:
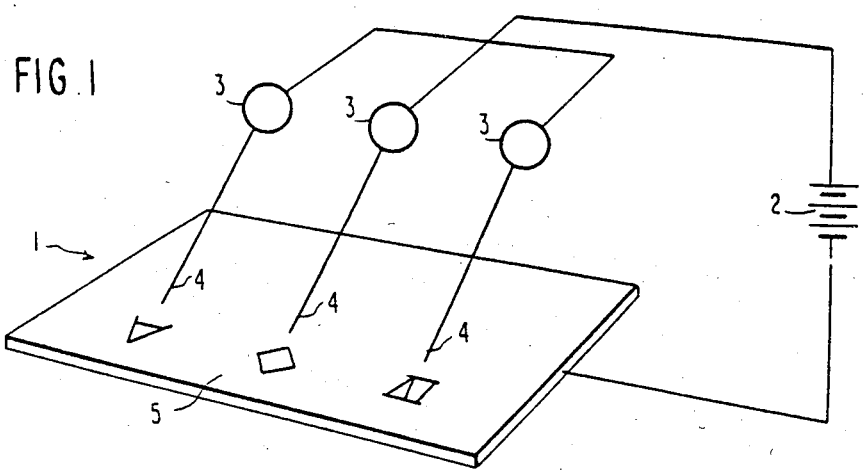
FIG. 1 of the drawings is a general schematic rendering of an illustrative electroerosion printing system.

The present invention generally comprises electroerosion recording materials coated, on their stylus contacting surface, with a lubricant composition comprising lubricating particles of graphite fluoride alone or in combination with graphite in a polymeric binder. Electroerosion materials for use as direct-negatives or direct masters can be prepared utilizing this invention.

In general, the lubricating layer should have a density between about 2 to 20 micrograms per square centimeter since lower concentrations give inadequate lubrication and higher concentrations are too thick for good writing at low writing voltages (about 50 V) and short pulse lengths (about 20 microseconds). If more energy is applied by increasing the voltage of the writing pulse and/or increasing the pulse length, thicker films can be used. Also the lubricating particulate to binder ratio should be adjusted so as to obtain overlayers with desired mechanical integrity and improved scratch resistance and shelf life of the recording material.

When graphite fluoride is employed in combination with other solid lubricants, any conductive laminar solid may be used but graphite is preferred as a co-lubricant material with graphite fluoride. Other materials which are expected to be useful include, for example, solids such as $MoS_2$, $WS_2$; other soft compounds such as AgI, PbO, Pb(OH)$_2$, and PbCo$_3$; and soft metal particles such as Sn, Cu, Ag, Pb, Au, Bi, Zn, Al, etc.

Any film forming polymer which is compatible with and capable of dispersing graphite fluoride or a combination of graphite fluoride and other solid conductive lubricants (mentioned above) and which does not cause stylus fouling during electroerosion printing can be used as the binder in the composition of this invention.

The graphite fluoride component of the lubricating coating may have resistivity in the range $10^9$–$1.0$ ohm-cm while the second component, where employed, may be a conductive material, preferably graphite, which generally has a resistivity of about $4.0 \times 10^{-2}$ ohm-cm. Other laminar solids besides graphite usable in this application include, for example, boron nitride, boric oxide, 2nO, $MoS_2$, and soft metal particles such as Zn, Al, Sn, Cu, Au, etc. Thus, non-conductive solids other than graphite fluoride can be present in the protective overlayers. Other such nonconductive solids include the fluorocarbons such as Teflon ™ (polytetrafluoroethylene).

Graphite fluoride is commercially available, such as Fluorographite ™, in a variety of particle sizes and with varying degrees of fluorination. For use herein, it is desired that the graphite fluoride has a particle size of about 0.05–5 $\mu$m, preferably about 0.5–2.0 $\mu$m or about the same particle size as that of the conductive lubricant such as graphite.

The fluorinated graphite or graphite fluoride $(CF_x)_n$ could have various degrees of fluorination, i.e., x is in the range of about 0.1 to 1.1, as long as it forms a stable and homogeneous dispersion with a polymer binder. Preferably, the degree of fluorination is about 0.4 to 0.5. Such materials are available from Ozark-Mahoning.

The detailed description of the invention can be better appreciated by reference to the accompanying drawings. FIG. 1 illustrates schematically an electroerosion printing system 1 which includes a source of electrical energy 2, which is connected with writing control means 3 for controlling the flow (voltage and pulse length) of electrical current to styli 4 which are electrodes in direct contact with the surface of the electroerosion recording material 5.

In operation, electric current pulses corresponding to information to be printed on the recording material 5 are transmitted through the writing control systems 3 to the styli 4. As a result, electrical discharges are generated at the surface of the recording material 5, producing very high local temperatures of selected areas of the thin surface film causing evaporation of the conductive layer and the surface film of layer, and exposing the underlying material to produce the desired image.

Means (not shown) are provided for moving the styli 4 relative to and in contact with the surface of the recording material 5. As the styli 4 move relative to the recording material 5 and the writing control means 3 direct pulses of current to the styli of sufficient voltage to cause arcing and evaporation of the conductive layer of the material, there can be recorded desired information, patterns and graphics of any kind. It is during the movement of the styli over and in contact with the surface of the recording material that the thin conductive metal film, in the absence of the adequate protection, is liable to be scratched in the unwritten areas, resulting in poor writing quality.

Also, the organic/inorganic debris that is generated as a consequence of the erosion of the surface layers during the printing process can accummulate on the print-head causing "baking" or "fouling" phenomenon which adversely affect print quality. This invention relates to lubricant protective overlayer compositions which reduce these problems commonly encountered with conventional lubricant layers in high resolution electroerosion recording.

Figure 2:
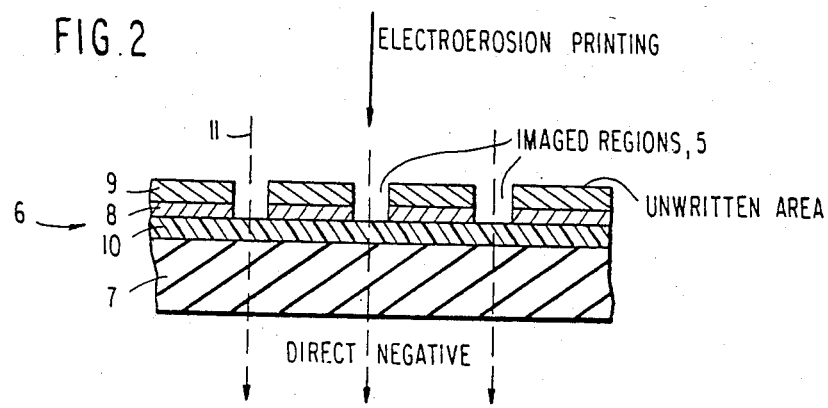
FIG. 2 of the drawings is a cross-sectional view of a direct negative made in accordance with this invention and showing the removal of surface layers in regions where electroerosion has been effected.
Figure 3:
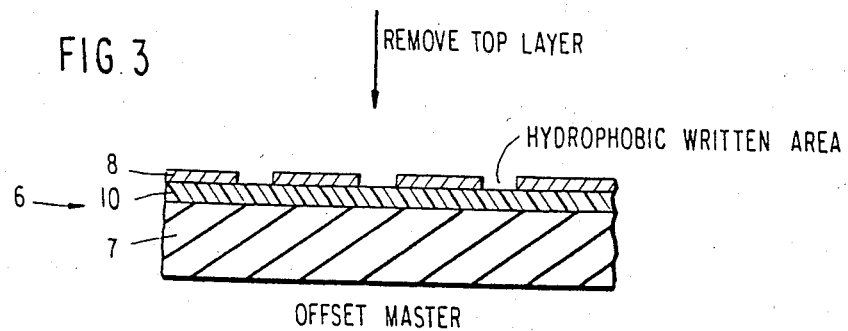
FIG. 3 of the drawings is a cross-sectional view of a direct offset master made in accordance with the invention and showing the removal of the surface protective layer to expose the hydrophilic, water wettable aluminum surface in the un-written region in contrast to the hydrophobic ink-receptive within region.

Referring to FIG. 2, the electroerosion recording material 6 of this invention is shown in cross-section to comprise a support 7 of paper, polymer film, etc., a thin, conductive, evaporable layer or film 8, and a lubricant layer or film 9; optionally a tough, hard, transparent film 10 may be positioned between the support 7 and the evaporable layer 8. This intermediate film 10 preferably is a layer comprising hard particles of average size between 3-5 $\mu$m, dispersed in a suitable polymeric binder, for example, silica particles in a cellulose-acetate-butyrate (CAB) polymeric binder, or as disclosed in co-pending application, Ser. No. 454,743, filed Dec. 30, 1982, now abandoned in favor of continuation application Ser. No. 692,008, filed Jan. 15, 1985 and assigned to the present assignee (the entire disclosure of which is expressly incorporated by reference), silica particles in a cross-linked polymer such as urethane cross-linked CAB, which may be light transmissive or transparent, to further reduce scratching of the material during electroerosion printing. The evaporable film 8 usually has a resistance from about 1 to 5 ohms per square centimeter and is frequently a vapor-deposited thin film of aluminum.

Where the backing or support is a light transparent or transmissive material, the resulting product can be used as a photomask or direct-negative medium for the development of photosensitive materials, e.g., in the production of offset lithography masters, circuit boards, etc. Where the styli have been energized and the lubricant film and conductive film burned off, light windows 11 are provided through the transparent backing so that the material is rendered selectively light (arrows) transmissive and may then be used in direct-photonegative or like applications.

Where the material is to be used as an offset master the support should be chosen to be an ink receptive material such as polyester. After imaging by electroerosion printing to expose the support layer selectively, the overlayer of lubricating composition can be removed, for example, by applying a solvent for the polymeric binder. This exposes the conductive layer which must be ink repellent. Aluminum is the commonly used material for the conductive layer and carries a thin aluminum oxide surface film which is inherently hydrophilic, i.e., repellent to oil based inks. Substrate 7, or optional film 10, is selected to provide the hydrophobic written areas as shown in FIG. 3. The removal of the overlayers can be accomplished by treating with commercial etching or sensitizing solutions such as FPC from A&M Multigraphics to provide improved hydrophilicity and reproduction definition using conventional oleophilic inks.

Debris generated during the electroerosion process from such a low energy layer is nonadherent to the styli and thus the lubricant layer provides protection against stylus fouling and is found to essentially eliminate the head wear problem encountered with non-graphite fluoride protective coatings.

Electroerosion recording materials of the invention may be prepared in accordance with the following procedure:

As a support, a flexible sheet of Mylar ® (polyethylene terephthalate)polyester, 50 micrometers thick was provided. On this support, using conventional web-coating apparatus, a coating comprising silica particles dispersed in a urethane crosslinked CAB binder was put down, as is described in the aforementioned co-pending U.S. patent application Ser. No. 454,743. Onto this layer there was evaporation deposited, by conventional technique, a thin conductive film of aluminum, about 20 $\mu$m to 40 $\mu$m thick.

Finally, using conventional web-coating apparatus a lubricating film was coated onto the aluminum layer.

The coating from which the lubricating layer or film was deposited comprised a dispersion containing the following ingredients in the indicated amounts and approximate percentages by weight:

I. 1.5 pounds ELECTRO-DAG 154, which contains:
  Graphite . . . 16%
  Polymeric Binder . . . 4%
  Solvent . . . 80%
II. 0.35 pound graphite fluoride*
  *Fluorographite TM $x=0.45$
III. 1.40 pound CAB solution (20% in methylethylketone:toluene at 80:20)
IV. 1.0 pound MEK and 0.5 pound toluene ELECTRO-DAG 154 from Acheson Colloid Co. comprises graphite, ethylcellulose (EC) binder and isopropanol solvent in the above proportions. The graphite fluoride was obtained from Pennwalt Chemicals and had a 0.45 degree of fluorination (about 38%F).

The above mixture of I-IV containing graphite:fluorographite:binder (CAB plus EC) at 26:37:37, by weight, respectively, was ball-milled for 48 hours then diluted with the MEK-toluene mixture at about a 1:20 ratio and applied as a thin coating yielding a surface covering of about 2 $\mu$g to 20 $\mu$g/cm$^2$ on the aluminized surface after drying/curing at about 100° C. for about 3 minutes to drive off the solvent.

Graphite fluoride as a solid lubricant can also be used in combination with other graphite formulations available from Graphite Products Corp. or Superior Graphite Corp. in place of the ELECTRO-DAG 154. Similarly, other grades of Fluorographites TM such as those having degrees of fluorination less than 0.45 or more than 0.45 can be usefully employed in the practice of this invention. Graphite fluoride can also be employed as a single lubricant particulate material without the incorporation of graphite.

Other binders can be used in the lubricant layer such as other cellulose esters and ethers, e.g., nitrocellulose, cellulose acetate, ethyl cellulose, cellulose acetate butyrate, or materials like polyvinyl acetate, polycarbonate, polyvinylbutyral, styrene polymers such as styrene maleic anhydride (SMA from Arco Co.), various polymeric acrylates and other acrylics, and a wide variety of other binders such as phenolic resins.

It is found that a wide range of binder concentrations by weight can be effectively used, e.g., from about 1 part binder to 4 parts graphite fluoride plus graphite to from about 1 part binder to 1 part graphite, fluoride plus graphite, as can be made by adding additional binder. When graphite fluoride is used alone in the absence of graphite, the amount of organic binder to graphite fluoride may be in the range of 1.0 to 0.2. The binder typically used is cellulose acetate butyrate CAB 553.4 from Eastman Chemical Corp. dissolved in an 80%:20% mixture of methyl ethyl ketone and toluene. The change in binder concentration changes the electrical conductivity of the overlayer. Depending on the details of the driver circuitry of the electroerosion printing system, in particular the maximum initial current which can be delivered by the driver, it is found advantageous to substitute partially or completely graphite fluoride (which has much reduced conductivity) for the highly conductive graphite. One advantage of this invention, as heretofore noted, is to be able to reduce conductivity without increasing organic insulating content, i.e., polymeric/binder, which in the present invention is maintained at 20–50% of total solids.

It is further noted that the graphite fluoride-containing protective overlayers provide low surface energy, low coefficient of friction, and improved sliding properties with contacting electrodes during printing. These characteristics are found highly desirable for reducing the wear of the print head and preventing the "baking" and "fouling" problem.

The solvent for the lubricating material-binder solids is not critical, as it need only be capable of satisfactorily dissolving the binder solids and providing stable dispersions of the compositions compatible with the coating technique which is utilized. Some available graphite-binder solids are provided in isopropanol solvent while others incorporate trichloroethane and many other solvents are no doubt useful in the invention.

The ratio of conductive particles to nonconductive particles in the lubricant layer will be selected depending upon the degree of conductivity and degree of inertness desired in the topcoat, through routine experimentation. As general guidelines, the ratio, by weight, of graphite fluoride to conductive particulate may be about 20:80 to 100:0; preferably about 30:70 to 50:50.

In using these materials prepared as described above, writing signals in the range of from about 30 to 60 volts are satisfactory to electroerode the conductive layer of these materials to expose the underlayer.

While this invention has been described in connection with specific embodiments, it will be understood that those of skill in the art may be able to develop variations of the disclosed embodiment without departing from the spirit of the invention or the scope of the following claims. For example, in order to avoid flake-off of lubricant particulate at low binder content, crosslinking agents such as titanate esters, chelates or polyisocyanates can be employed along with a suitable cross-linkable binder in the formation of a lubricant coating composition. In this embodiment, materials should be selected to form a cross-linked network when solvent is evaporated after the coating step.

We claim:

1. Electroerosion recording material comprising: a non-conductive support member, a thin conductive member, said conductive member being evaporable in response to arcing and high local temperatures obtained in an electroerosion recording process, and an overlayer of protective lubricant composition applied from a liquid onto the stylus-contacting surface of said conductive member, said lubricant composition comprising discrete graphite fluoride particles alone as a solid lubricant or in combination with conductive particles of high lubricity dispersed in a polymeric binder, the particle sizes of said graphite fluoride being in the range 0.05–5 micrometers and the particle size of the conductive particles being in the range 0.05–5 micrometers, the density of said overlayer being from about 2 to 20 micrograms per square centimeter, and the ratio of binder to lubricant particles in said overlayer being sufficient substantially to provide smudge resistance and prevent flake-off during handling and use of said material.

2. The material of claim 1, wherein said binder is a polymer selected from the group consisting of cellulosic materials, including cellulose acetate, ethyl cellulose, cellulose acetate butyrate, and nitrocellulose, polyvinyl acetate, polycarbonate resins, polystyrenes, polystyrene-maleic anhydride, acrylic polymers, polyvinylbutyral and phenolic resins.

3. The material of claim 1 wherein the binder is un-cross-linked or cross-linked cellulose acetate butyrate.

4. The material of claim 1, wherein the amount of binder in said overlayer is from 20 to 50 percent by weight of the film and the balance essentially solid lubricating particles.

5. The material of claim 4, wherein the conductive particles are graphite, the graphite fluoride:graphite being present in a ratio of about 100:0 to 20:80.

6. The material of claim 1, wherein said support is a light transmissive material such that, after electroerosion of the conductive member, the material may be utilized in direct-negative applications.

7. The material of claim 1, further comprising a thin, hard layer of cross-linked polymer between said support and said conductive member, said layer serving to increase the resistance to scratching of said material during electroerosion recording.

8. The material of claim 7, wherein said layer of cross-linked polymer is filled with silica particles.

9. An electroerosion recording medium wherein electric pulses in a plurality of recording styli are used to erode selected portions of said medium, said medium being comprised of a support member, a thin conductive layer being erodable in response to the application of said electric pulses from said recording styli, and an overlayer of a protective lubricant composition on the styli-contacting surface of said thin conductive layer, said overlayer being applied from a liquid onto said thin conductive layer and being comprised of discrete graphite fluoride particles dispersed in a binder, said graphite fluoride having particle sizes in the range 0.05–5 micrometers and comprising 80–50% by weight of these solids in said overlayer.

10. The recording medium of claim 9, where the density of said overlayer is in the range from about 2–20 micrograms per square centimeter.

11. The recording medium of claim 10, where said electrical pulses are approximately 30–60 volts in amplitude and have pulse widths in the microsecond range.

12. The recording medium of claim 11, where said overlayer further includes discrete graphite particles, the particle size of said graphite being in the range 0.05–5 micrometers.

13. The recording medium of claim 9, where said medium further includes a hard, crossed-linked polymer layer located between said support member and said thin conductive layer.

14. An electroerosion recording medium wherein electrical pulses in a plurality of recording styli are used to erode selected portions of said medium, said medium being comprised of a support member, a thin conductive layer, and an overlayer of protective lubricant composition on the styli-contacting surface of said thin conductive layer, said overlayer being applied from a liquid onto said thin conductive layer and being comprised of discrete graphite particles and Teflon TM (polytetrafluoroethylene) in a binder, where said graphite has a particle size in the range 0.05–5 micrometers, and said binder is present in said overlayer in an amount 20–50% by weight of the solids in said overlayer.

15. The recording medium of claim 14, where the density of said overlayer is in the range of approximately 2–20 micrograms per square centimeter.

16. The recording medium of claim 15, where said electrical pulses have amplitudes of approximately 30–60 volts and pulse widths in the microsecond range.

17. The recording medium of claim 16, where said medium includes a layer of hard, crossed-linked polymer located between said support member and said thin conductive layers.

* * * * *